FREQUENCY MODULATION SYSTEM AND CRYSTAL DISCRIMINATOR THEREFOR

Filed Feb. 8, 1960 2 Sheets-Sheet 1

INVENTORS
Robert E. Lee
& Richard I. Kearley, Jr.
BY
Stevens, Davis, Miller & Mosher
ATTORNEYS INVENTORS
Robert E. Lee
& Richard I. Kearley, Jr.
BY
Stevens, Davis, Miller & Mosher
ATTORNEYS 3,156,878
FREQUENCY MODULATION SYSTEM AND CRYSTAL DISCRIMINATOR THEREFOR Robert E. Lee and Richard I. Kearley, Jr., Dallas, Tex., assignors to Texas Instruments Incorporated, Dallas, Tex., a corporation of Delaware Filed Feb. 8, 1960, Ser. No. 7,421
12 Claims. (Cl. 332—19)

This invention relates to frequency modulation and more particularly to a system for providing improved stability of the center frequency in a frequency modulator. The invention also relates to a crystal discriminator circuit which is part of the frequency modulation system of the invention.

In a frequency modulator an output signal is generated having a frequency which varies in accordance with an input signal. The output frequency with an input signal of zero is known as the center frequency. The frequency of the output signal varies symmetrically about this center frequency in accordance with the input signal. The frequency modulator usually comprises an oscillator tuned to oscillate at the center frequency. The input signal is applied in such a manner to cause the frequency of oscillation to change in accordance with the magnitude and polarity of the input signal.

The oscillation frequency of oscillators which are tuned by reactances such as capacitors and inductors will drift with time and change with temperature. Therefore, the center frequency produced by a frequency modulator comprising such an oscillator will change with time and temperature. The oscillation frequency of an oscillator which is tuned solely by a crystal will not vary as much with time or temperature as that of an oscillator which is tuned with other reactive components, but such a crystal oscillator does not lend itself readily to frequency modulation. In order to provide frequency modulation with a crystal oscillator, the tuned circuit which controls the oscillation frequency must comprise, in addition to the crystal, a reactance which will vary in accordance with the input signal. This additional reactance will also vary with temperature, and therefore the center frequency of the frequency modulated output signal will change with temperature. Thus, the additional reactance necessary to permit frequency modulation makes the center frequency temperature sensitive and the purpose of using a crystal oscillator is defeated.

The present invention provides a frequency modulator in which the center frequency will not vary substantially with time or temperature. The system of the invention makes use of a conventional FM oscillator, the oscillation frequency of which is controlled in accordance with an audio input signal. The output signal of the oscillator is fed to a crystal discriminator which provides an output signal voltage which varies in magnitude and polarity in accordance with the variation in the signal frequency from the center frequency. The audio frequencies in the output signal voltage from the discriminator are filtered out and the resulting filtered signal voltage is fed back to the oscillator to control the frequency of the oscillator. Whenever the center frequency of the oscillator tends to vary, a signal voltage will be produced at the output of the discriminator which will be fed back to the oscillator to counteract the change in center frequency. In this manner the center frequency is controlled substantially by a crystal alone, the crystal being the crystal of the discriminator and thus the center frequency will not drift with time or vary substantially with changes in temperature.

The crystal discriminator should provide a sharp change in output voltage with changes in frequency as it passes through the center frequency because the greater the change in output voltage, the greater the feedback signal and the more precisely the center frequency will be maintained constant. The output voltage of the crystal discriminator should be large when the frequency is well below or above the center frequency. A discriminator having this characteristic is described as having a broad skirt. A broad skirt is needed because when the oscillator is turned on, it may start oscillating at a frequency far from the center frequency because it is cold or because it is doubling off center. If the discriminator did not have a broad skirt, the output signal voltage of the discriminator would be small when oscillation at a frequency far from the desired center frequency occurred, and, as a result, the discriminator would not readily bring the oscillation frequency to the desired center frequency. The frequency at which the discriminator generates an output signal voltage of zero should be constant and should not change with temperature or time. Prior to the present invention, a discriminator having all of the above described characteristics was not available. All three of these characteristics are provided by the discriminator of the present invention.

Discriminators themselves are old in the art. Illustrative of those heretofore proposed is that schematically depicted in FIGURE 10–13, page 523 of "Radio Engineering," by Terman, third edition, published by McGraw-Hill Book Company, Inc., in 1947. Such discriminators have been found to exhibit the above-described undesirable changes in characteristics with temperature and time, and therefore have not been suitable for stabilizing frequency modulated oscillators. However, in accordance with this invention, it has been discovered that if the RF choke depicted in FIGURE 10–13 of the Terman reference is replaced with a crystal resonant at the desired center frequency, and if a suitable inductor is connected in parallel with the crystal to resonate the inherent crystal capacitance at that same frequency, then the discriminator is stabilized both as to its operating point and as to its characteristics over a wide range of temperatures and time. Moreover, the response of the discriminator is greatly sharpened so that the incremental voltage output with each tiny incremental deviation in frequency from that of the center is greatly enlarged thereby resulting in a much tighter locking of the oscillator frequency to the desired operating point.

The discriminator, as modified in accordance with the principles of this invention provides a large output voltage of one polarity at frequencies from just below to far below the desired center frequency and a large output voltage of the opposite polarity from just above to far above the desired center frequency. The output voltage characteristic varies with input frequency linearly with a steep slope from just above the desired center frequency to just below the desired center frequency and it passes through the zero voltage coordinate precisely at the desired center frequency.

Further objects and advantages of the present invention will become readily apparent as the following detailed description of the invention unfolds and when taken in conjunction with the drawings wherein.

Figure 1:
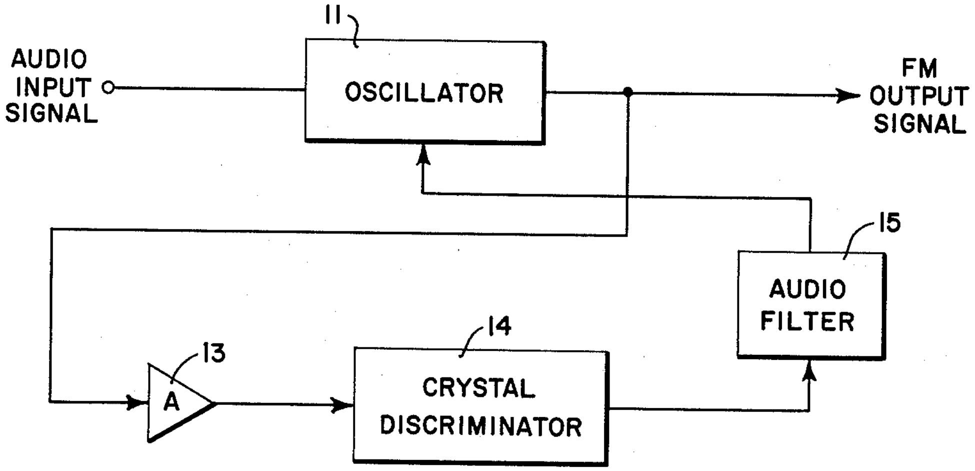
FIGURE 1 is a block diagram of the system.

As shown in FIGURE 1 the system of the invention comprises an oscillator 11, which generates the carrier signal which is to be frequency modulated. The audio input signal, which is to frequency modulate the carrier, is applied to the oscillator 11. The oscillation frequency of the oscillator 11 will vary symmetrically about a center frequency in accordance with this applied audio input signal, and thus a frequency modulated output signal is generated. The output signal of the oscillator 11 is amplified by an amplifier 13, and is then applied to crystal discriminator 14. The crystal discriminator 14 is tuned to a predetermined frequency, which is selected to be at the desired center frequency of the frequency modulator. The crystal discriminator 14 produces an output signal voltage having a magnitude and a polarity corresponding to the difference between the predetermined frequency at which the crystal is resonant and the frequency of the signal applied to the crystal discriminator 14 by the amplifier 13. The output signal voltage from the discriminator 14 is applied to a filter 15, which filters out the audio frequencies from the output signal voltage of the crystal discriminator 14. The output signal voltage of the audio filter 15 will, therefore, represent the deviations of the center frequency of the oscillator 11 from the desired center frequency. The output signal from the audio filter 15 is applied back to the oscillator 11 to correct the deviation. In this manner, the center frequency of the frequency modulator is maintained at the desired center frequency, and thus the resonant frequency of the crystal of the crystal discriminator determines the center frequency of the modulator.

Figure 2:
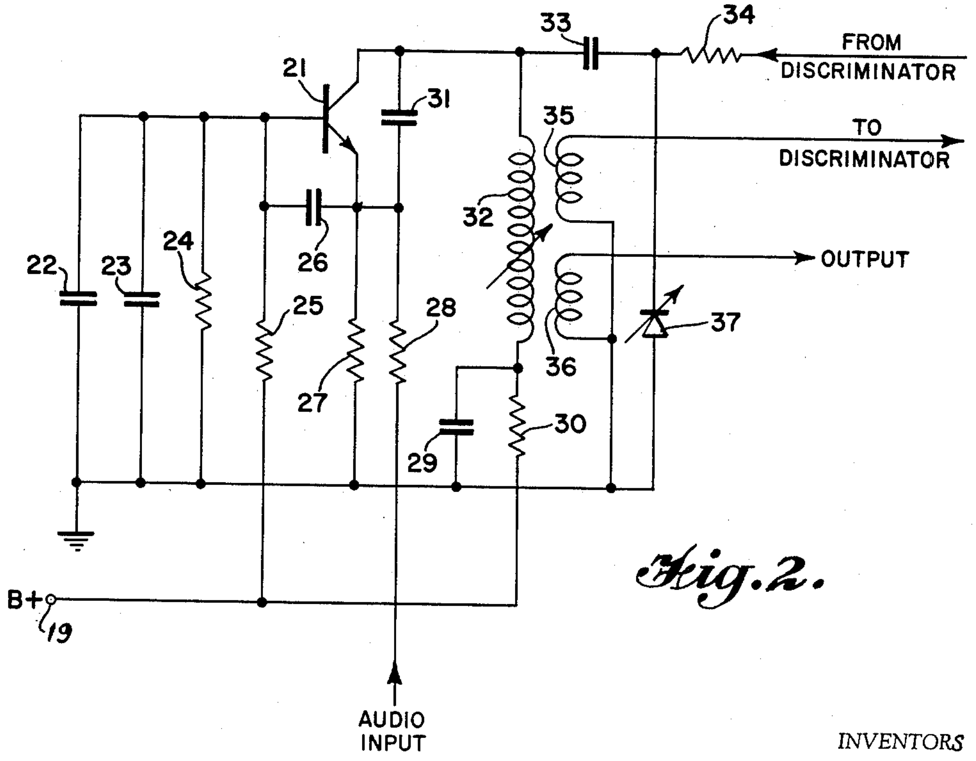
FIGURE 2 illustrates the circuitry of the FM oscillator of the system.

As shown in FIGURE 2, the oscillator of the system comprises an NPN transistor 21. Power is supplied to the transistor 21 from a source of positive supply voltage applied at a terminal 19, which is connected to the collector of the transistor 21 over a series circuit of a resistor 30 and a variable inductor 32. A resistor 27 connects the emitter of the transistor 21 to ground to complete the circuit for the power supply. A resistor 25 connects the terminal 19 to the base of the transistor 21 and the resistor 24 connects the base of transistor 21 to ground. Resistors 25 and 24 form a voltage divider to provide the correct bias to the base of the transistor 21. The capacitor 31 connects the collector of the transistor 21 to the emitter. A capacitor 26 is connected between the base and the emitter of the transistor 21. A parallel circuit of capacitors 22 and 23 is connected between the base of the transistor 21 and ground. The collector of the transistor 21 is connected to ground through a series circuit comprising a capacitor 33, and a semiconductor junction diode 37. A capacitor 29 shunts the junction between the inductor 32 and the resistor 30 to ground. The variable inductor 32 comprises the primary of a transformer, which has two secondary windings 35 and 36. One side of each of these secondaries 35 and 36 is connected to ground. The signal induced in the secondary 36 provides the frequency modulated output of the oscillator. The signal induced in the winding 35 is amplified by the amplifier 13 and applied to the crystal discriminator 14 as described with reference to FIGURE 1. The output signal voltage from the crystal discriminator 14 after being filtered is applied to the junction between the capacitor 33 and the diode 37 over a resistor 34. The audio input signal to the oscillator, which is to modulate the carrier, is applied to the emitter of the transistor 21 over the resistor 28.

The above described circuit is a Colpitts transistor oscillator. The reactance of the parallel circuit of the capacitors 22 and 23 and of the capacitor 29 is negligible at the oscillation frequency of the oscilator and thus the inductor 32 is effectively connected in parallel with the series circuit of capacitors 26 and 31, the series circuit of the capacitor 33 and the diode 37, and the transistor 21. Thus, the inductor 32 provides the inductive reactance of a tank circuit which tunes the oscillator. The diode 37 and the transistor 21 provide shunt capacitances across their junctions and the capacitive component of the tank circuit is made up of the capacitors 31 and 26, the capacitor 33 and the shunt capacitance of the diode 37, and the shunt capacitance of the transistor 21. The capacitive effect of the transistor 21 depends upon the width of the depletion layers associated with the junctions of the transistor and the width of these depletion layers will vary in accordance with audio input signal applied to the emitter of the transistor 21. The audio input signal applied to the emitter of the transistor 21 thus controls the capacitive effect provided in the tank circuit by the transistor 21. Thus, the oscillation frequency of the oscillator will vary in accordance with the audio input signal and frequency modulation is achieved. The capacitance provided by the semiconductor junction diode 37 also depends upon the width of the depletion layer association with the junction of the diode, which in turn, depends upon the voltage applied across the diode 37. In this manner, the capacitive reactance of the tank circuit and the oscillation frequency of the oscillator is controlled in accordance with the output signal from the discriminator applied across the diode 37.

Figure 3:
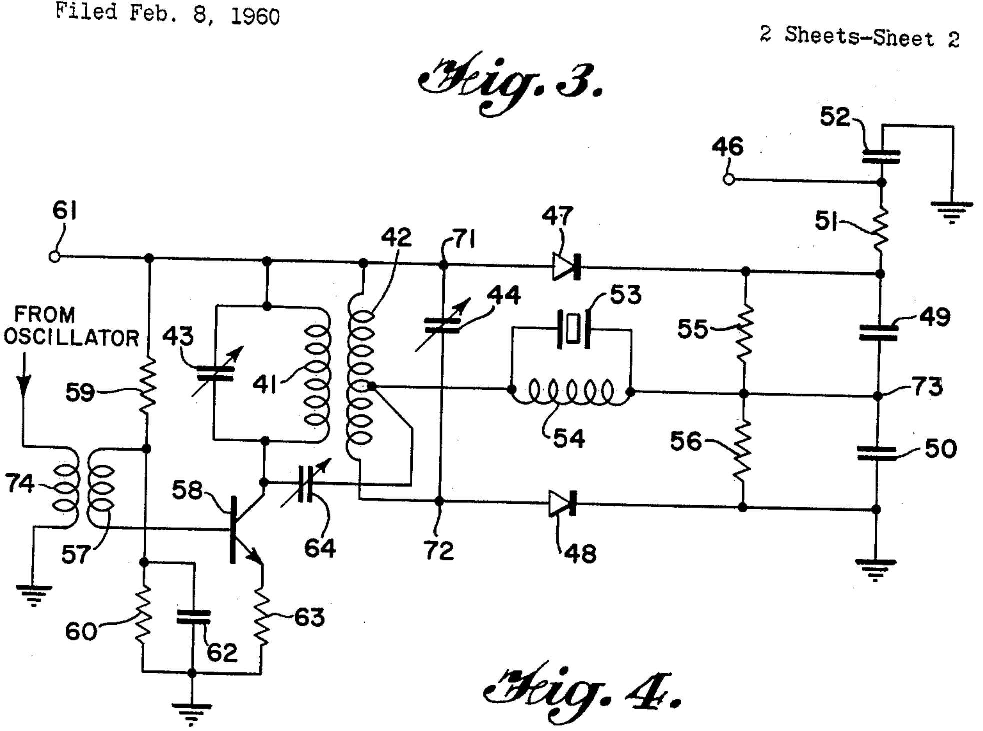
FIGURE 3 shows the circuitry of the crystal discriminator of the system.

As shown in FIGURE 3 the crystal discriminator of the system comprises a transformer having a primary winding 41 and a center tapped secondary winding 42. The transformer is double tuned to a predetermined frequency by the variable capacitor 43 connected across the primary winding 41 and a variable capacitor 44 connected across the secondary winding 42. This predetermined frequency is selected to be the desired center frequency. The output from the crystal discriminator is designated by the reference number 46, and one side of the secondary winding 42 is connected to output 46 through a diode rectifier 47. The other side of the secondary winding 42 is connected to ground through a diode rectifier 48. The circuit point at the junction between the secondary winding 42 and the diode 47 is designated 71 and the circuit point at the junction between the secondary winding 42 and the diode 48 is designated by the reference number 72. A pair of series-connected capacitors 49 and 50 having equal capacities connect the output 46 through resistor 51 to ground. The circuit point at the junction between capacitors 49 and 50 is designated by the reference number 73. A resistor 55 is connected across the capacitor 49 and a resistor 56 is connected across the capacitor 50. The output 46 is also connected to ground through capacitor 52. The center tap of the secondary winding 42 is connected to the circuit point 73 by means of a parallel circuit comprising a crystal 53 and an inductor 54. The crystal 53 is selected to be resonant at the desired center frequency and the inductor 54 is tuned to resonate with the shunt capacitance of the crystal 53 at the desired center frequency. The input signal to the crystal discriminator may be introduced to coil 57 via link 74. One side of the coil 57 is connected to the base of an NPN transistor 58. The other side of the coil 57 is connected to the junction between a pair of series-connected resistors 59 and 60. The series circuit of the resistors 59 and 60 is connected between ground and a 20 volt positive D.C. source applied at a terminal 61. A capacitor 62 is shunted across the resistor 60. The parallel circuit of the capacitor 43 and the primary winding 41 connect the 20 volt positive D.C. source at terminal 61 to the collector of the transistor 58. The emitter of the transistor 58 is connected to ground by means of a resistor 63. A variable capacitor 64 connects the collector of the transistor 58 to the center tap of the secondary winding 42.

The input signal induced in the coil 57 is applied between the base of the transistor 58 and ground, the capacitor 62 providing a shunt to ground at the frequency of the input signal. The resistors 59 and 60 comprise a voltage divider to provide the correct bias to the base of the transistor 58. The input signal is amplified by the transistor 58 and is applied across the parallel circuit of the capacitor 43 and the primary winding 41. The resulting current flowing in the primary winding 41 induces a voltage in the secondary winding 42. The amplified voltage produced at the collector of the transistor 58 is also applied to the center tap of the secondary winding 42 by means of the capacitor 64, which is small enough to provide a substantial reactance at the frequency of the input signal.

The signal voltage generated at the output 46 depends upon the relative magnitudes of the A.C. voltages produced between the circuit points 71 and 73 and between the circuit points 72 and 73. When the applied input signal is at the resonant frequency of the crystal 53, these two voltages will be equal and the resulting signal voltage produced at the output 46 will be zero. As the input signal frequency changes, passing through the resonant frequency of the crystal, there is a sharp change in phase and magnitude of the impedances in the double tuned transformer and between the center tap of the secondary winding 42 and the circuit points 73. The changes in these impedances have a cumulative effect on the voltages between the circuit points 71 and 73 and between the circuit points 72 and 73. As a result, when the input signal frequency is just below the resonant frequency of the crystal 53, the A.C. voltage between the circuit points 71 and 73 will be much larger than that between circuit points 72 and 73. Thus, a large positive signal voltage will be produced at the output 46. When the input signal frequency is just above the resonant frequency of the crystal 53, the A.C. voltage between circuit points 71 and 73 will be much smaller than that between circuit points 72 and 73 and a large negative signal voltage will be produced at the output 46.

Figure 4:
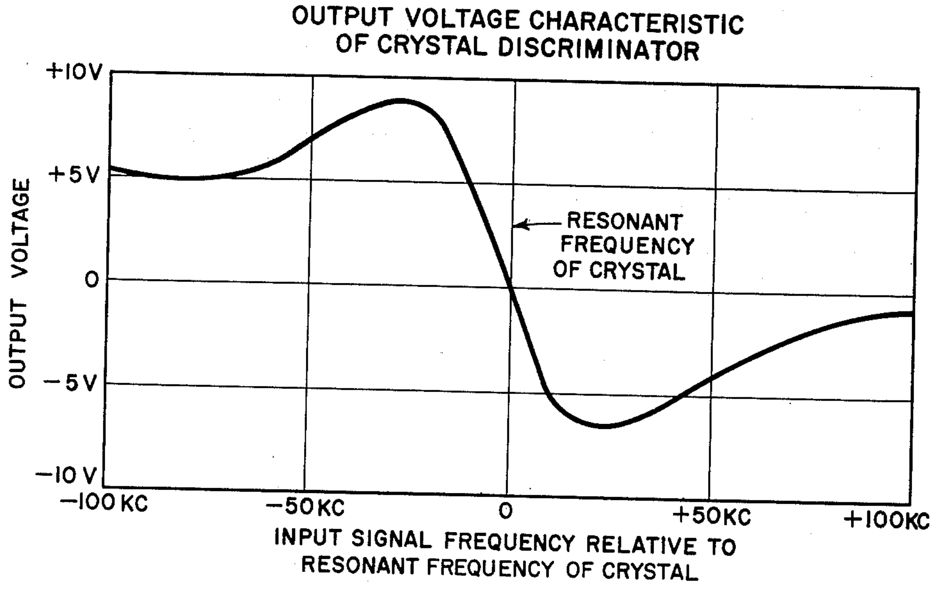
FIGURE 4 illustrates the relative relation of the output voltage versus input frequency characteristic of the discriminator.

FIGURE 4 illustrates how the output signal voltage changes with signal input frequency. From just above the resonant frequency to just below the resonant frequency, the output voltage changes linearly with a steep slope. The characteristic passes through the zero voltage ordinate precisely at the resonant frequency of the crystal 53. Changes in the circuit values will change the slope of the characteristic but not the point at which the characteristic passes through the zero voltage ordinate. The output is a large positive voltage down to 100 kilocycles below the resonant frequency and a large negative voltage almost up to 100 kilocycles above the resonant frequency. Thus, the characteristic has a broad skirt. It will be noted from FIGURE 4 that the skirt is broader on the low side than on the high side. A broader skirt is needed on the low side than on the high side, because when the oscillator is first turned on it will start oscillating on the low side. The broad skirt of the discriminator characteristic on the low side means that the output signal voltage of the discriminator will be large when the oscillator is first turned on, and the oscillation frequency then will be brought quickly up to the desired center frequency.

The above description is of a preferred embodiment of the invention and many modifications may be made thereto without departing from the spirit and scope of the invention which is limited only as defined in the appended claims.

What is claimed is:

1. A frequency modulator having a stabilized center frequency comprising an oscillator having first and second inputs, said oscillator having a means to vary its oscillation frequency in accordance with the signal applied to said first input and a means to increase its oscillation frequency in response to a signal voltage of one polarity applied to said second input and to decrease its oscillation frequency in response to a signal voltage of the opposite polarity applied to said second input, a transformer having a primary winding and a center tapped secondary winding, means to apply the output signal of said oscillator across said primary winding, a reactive circuit element for conducting a portion of the signal applied across said primary winding to the center tap of said secondary winding, first and second capacitors connected in series between a first circuit point and a second circuit point, a crystal connected between the center tap of said secondary winding and the junction between said first and second capacitors, a first rectifier connected between one side of said secondary winding and said first circuit point, a second rectifier connected between the other side of said secondary winding and said second circuit point, a third capacitor connected across said secondary winding capable of being tuned with said secondary winding at the resonant frequency of said crystal, an inductor shunted across said crystal tuned with the shunt capacitance of said crystal at the resonant frequency of said crystal, means to filter a predetermined range of frequencies from the signal voltage produced across the series circuit of said first and second capacitors and to apply the resulting filtered signal voltage to said second input of said oscillator.

2. A frequency modulator having a stabilized center frequency comprising an oscillator having first and second inputs, said oscillator having a means to vary its oscillation frequency in accordance with the signal applied to said first input and a means to increase its oscillation frequency in response to a signal voltage of one polarity applied to said second input and to decrease its oscillation frequency in response to a signal voltage of the opposite polarity applied to said second input, a transformer having a primary winding and a center tapped secondary winding, means to apply the output signal of said oscillator across said primary winding, means to apply at least a portion of the signal across said primary winding to the center tap of said secondary winding, first and second capacitors connected in series between a first circuit point and a second circuit point, a crystal connected between the center tap of said secondary winding and the junction between said first and second capacitors, a first rectifier connected between one side of said secondary winding and said first circuit point, a second rectifier connected between the other side of said secondary winding and said second circuit point, a third capacitor connected across said secondary winding capable of being tuned with said secondary winding at the resonant frequency of said crystal, means to filter a predetermined range of frequencies out of the signal voltage generated across the series circuit of said first and second capacitors and to apply the resulting filtered signal voltage to said second input of said oscillator.

3. A frequency modulator having a stabilized center frequency comprising an oscillator having a first and second input, said oscillator having a means to vary its oscillation frequency in accordance with the signal applied to said first input and a means to increase its oscillation frequency in response to a signal voltage of one polarity applied to said second input and to decrease its oscillation frequency in response to a signal voltage of the opposite polarity applied to said second input; a crystal; discriminator circuit means including said crystal to generate a signal voltage of said one polarity when the oscillation frequency of said oscillator is below the resonant frequency of said crystal, to generate a signal voltage of the opposite polarity when the oscillation frequency of said oscillator is above said resonant frequency, and to generate a zero signal voltage when said oscillation frequency is at said resonant frequency; and a filter means connected to filter a predetermined range of frequencies out of the signal voltage generated by said discriminator circuit means and to apply the resulting filtered signal voltage to said second input.

4. A discriminator comprising a transformer having a primary winding and a center tapped secondary winding, means to apply an input signal across said primary winding, a reactive circuit element for conducting at least a portion of the signal across said primary winding to the center tap of said secondary winding, an output terminal, first and second capacitors connected in series between said output terminal and a reference potential, a crystal connected between the center tap of said secondary winding and the junction between said first and second capacitors, an inductor shunted across said crystal tuned with the shunt capacitance of said crystal at the resonant frequency of said crystal, a first rectifier connected between one side of said secondary winding and said output terminal, a second rectifier connected between the other side of said secondary winding and said reference potential, and a third capacitor connected across said secondary winding capable of being tuned with said secondary winding at the resonant frequency of said crystal.

5. A crystal discriminator comprising a transformer having a primary winding and a center tapped secondary winding, means to apply an input signal across said primary winding, a reactive circuit element for conducting at least a portion of the signal across said primary winding to the center tap of said secondary winding, an output terminal, first and second capacitors connected in series between said output terminal and a reference potential, a crystal connected between the center tap of said secondary winding and the junction between said first and second capacitors, a first rectifier connected between one side of said secondary winding and said output terminal, a second rectifier connected between the other side of said secondary winding and said reference potential, and a third capacitor connected across said secondary winding capable of being tuned with said secondary winding at the resonant frequency of said crystal.

6. A discriminator comprising a transformer having a primary winding and a center tapped secondary winding, means to apply an input signal across said primary winding, means to apply at least a portion of the signal across said primary winding to the center tap of said secondary winding, an output terminal, first and second capacitors connected in series between said output terminal and a reference potential, a crystal connected between the center tap of said secondary winding and the junction between said first and second capacitors, an inductor shunted across said crystal tuned with the shunt capacitance of said crystal at the resonant frequency of said crystal, a first rectifier connected between one side of said secondary winding and said output terminal, a second rectifier connected between the other side of said secondary winding and said reference potential, and a third capacitor connected across said secondary winding capable of being tuned with said secondary winding at the resonant frequency of said crystal.

7. A discriminator comprising a transformer having a primary winding and a center tapped secondary winding, means to apply an input signal across said primary winding, means to apply at least a portion of the signal across said primary winding to the center tap of said secondary winding, an output terminal, first and second capacitors connected in series between said output terminal and a reference potential, a crystal connected between the center tap of said secondary winding and the junction between said first and second capacitors, a first rectifier connected between one side of said secondary winding and said output terminal, a second rectifier connected between the other side of said secondary winding and said reference potential, and a third capacitor connected across said secondary winding capable of being tuned with said secondary winding at the resonant frequency of said crystal.

8. In a discriminator having reactive input circuits, output-signal-developing impedance means and asymmetrical current means interconnecting said circuits with said impedance means to develop across said impedance means output voltages proportional to deviations in frequency from a predetermined frequency of a signal applied to said input circuits, the improvement comprising crystal means including a crystal interconnecting said impedance means with said input circuits, said crystal means also including an inductor bridged across said crystal and tuned to resonate with the capacitance of said crystal to the crystal resonant frequency.

9. In a discriminator circuit:

(*a*) a center-tapped reactive input having first and second portions, (*b*) first and second output-signal-developing impedance means having a common terminal, (*c*) first and second asymmetrically-conducting means, (*d*) a crystal resonant to a particular frequency, (*e*) conductive means serially connecting the first portion of the reactive input, the first impedance means and the first asymmetrically-conducting means in a first closed series circuit with the crystal, (*f*) conductive means serially connecting the second portion of the reactive input, the second impedance means, and the second asymmetrically-conducting means in a second closed series circuit with the crystal, (*g*) the discriminator circuit being effective to develop across the first and second impedance means output voltages proportional to deviations in frequency of a signal applied to said input from a preselected frequency.

10. Apparatus according to claim 9 wherein an inductor shunts said crystal and is resonant with the shunt capacitance of the crystal to the said particular frequency.

11. In a discriminator circuit:

(*a*) a reactive input resonant to a particular frequency having first and second portions with a common tap, (*b*) first and second output-signal-developing impedance means having a common terminal, (*c*) first and second asymmetrically-conducting means, (*d*) a two-terminal crystal device resonant to said particular frequency, (*e*) first conductive means serially connecting the first portion of the reactive input and the first impedance means in a first closed series circuit with the first asymmetrically-conducting means and the crystal device, (*f*) second conductive means serially connecting the second portion of the reactive input and the second impedance means in a second closed series circuit with the second asymmetrically-conducting means and the crystal device, (*g*) the first and second conductive means connecting the crystal device between the common tap of the reactive input and the common terminal of the impedance means, (*h*) the discriminator circuit being effective to develop across the impedance means output voltages proportional to deviations in frequency of a signal applied to the input from the particular frequency.

12. Apparatus according to claim 11 wherein an inductor shunts said crystal device and is resonant with the shunt capacitance of the crystal to said particular frequency.

References Cited in the file of this patent

UNITED STATES PATENTS

| | | |
|---|---|---|
| 2,233,199 | Donley | Feb. 25, 1941 |
| 2,312,079 | Crosby | Feb. 23, 1943 |
| 2,483,438 | Royden | Oct. 4, 1949 |
| 2,768,293 | Hofweegen | Oct. 23, 1956 |

FOREIGN PATENTS

| | | |
|---|---|---|
| 987,977 | France | Aug. 21, 1951 |